(12) United States Patent
Johnson et al.

(10) Patent No.: US 10,054,616 B2
(45) Date of Patent: Aug. 21, 2018

(54) ENERGY MONITORING DEVICE

(71) Applicant: OutSmart Power Systems, LLC, Natick, MA (US)

(72) Inventors: Kevin M. Johnson, Natick, MA (US); Greg Hunter, Dover, MA (US); Paul C. M. Hilton, Millis, MA (US)

(73) Assignee: The NanoSteel Company, Inc., Providence, RI (US)

( * ) Notice: Subject to any disclaimer, the term of this patent is extended or adjusted under 35 U.S.C. 154(b) by 466 days.

(21) Appl. No.: 13/968,552

(22) Filed: Aug. 16, 2013

(65) Prior Publication Data

US 2014/0103905 A1    Apr. 17, 2014

Related U.S. Application Data

(63) Continuation of application No. PCT/US2012/025696, filed on Feb. 17, 2012.
(Continued)

(51) Int. Cl.
*G01R 19/00* (2006.01)
*G01R 15/18* (2006.01)
(Continued)

(52) U.S. Cl.
CPC ........... *G01R 19/00* (2013.01); *G01R 15/181* (2013.01); *G01R 21/06* (2013.01); *G01R 22/063* (2013.01); *G01R 1/04* (2013.01); *G01R 22/065* (2013.01)

(58) Field of Classification Search
CPC ...... G01R 15/181; G01R 15/18; G01R 15/14; G01R 15/142; G01R 15/207; G01R 21/00; G01R 21/06; G01R 21/08; G01R 22/00; G01R 22/061; G01R 22/063; G01R 19/00; G01R 1/067; G01R 1/07; G01R 1/073

See application file for complete search history.

(56) References Cited

U.S. PATENT DOCUMENTS 4,080,034 A * 3/1978 Werner ................ H01R 4/2408
                                                                439/413
5,166,887 A * 11/1992 Farrington ............... H02H 3/00
                                                                361/94

(Continued)

OTHER PUBLICATIONS

International Search Report and Written Opinion dated May 29, 2012, issued in related International Patent Application No. PCT/US12/25696.

*Primary Examiner* — Huy Q Phan
*Assistant Examiner* — David Frederiksen
(74) *Attorney, Agent, or Firm* — Grossman, Tucker, Perreault & Pfleger, PLLC

(57) ABSTRACT

A device and method are provided for monitoring voltage and current in a continuous conductor. A current sensor is configured to sense current in the continuous conductor. A voltage sense conductor is provided and a guided path is configured to bring the voltage sense conductor into contact with the continuous conductor at a pre-determined orientation. A communication interface is configured to receive information about a common reference voltage from a source, the source being external to the device. A voltage measuring circuit is configured to estimate voltage between a voltage sensed by the voltage sense conductor and the common reference voltage using the information about the common reference voltage.

32 Claims, 9 Drawing Sheets

Related U.S. Application Data

(60) Provisional application No. 61/444,057, filed on Feb. 17, 2011.

(51) Int. Cl.
  G01R 21/06 (2006.01)
  G01R 22/06 (2006.01)
  G01R 1/04 (2006.01)

(56) References Cited

U.S. PATENT DOCUMENTS

| | | | | |
|---|---|---|---|---|
| 5,473,244 A * | 12/1995 | Libove | | G01R 1/22 |
| | | | | 324/126 |
| 6,165,004 A * | 12/2000 | Robinson | | H01R 4/2408 |
| | | | | 439/411 |
| 6,366,076 B1 * | 4/2002 | Karrer | | G01R 15/181 |
| | | | | 324/117 R |
| 6,470,283 B1 * | 10/2002 | Edel | | G01R 19/2513 |
| | | | | 324/72.5 |
| 6,875,045 B1 * | 4/2005 | Hollick | | H01R 4/363 |
| | | | | 439/411 |
| 7,265,533 B2 * | 9/2007 | Lightbody | | G01R 15/142 |
| | | | | 324/126 |
| 7,282,904 B2 * | 10/2007 | Suquet | | G01R 15/185 |
| | | | | 324/117 H |
| 7,397,233 B2 * | 7/2008 | Sorensen | | G01R 15/16 |
| | | | | 324/129 |
| 7,755,347 B1 * | 7/2010 | Cullen | | G01R 15/20 |
| | | | | 324/117 H |
| 8,493,053 B2 * | 7/2013 | de Buda | | G01R 15/06 |
| | | | | 324/103 R |
| 2004/0119445 A1 * | 6/2004 | Wakeman | | G01R 31/362 |
| | | | | 320/156 |
| 2005/0156587 A1 * | 7/2005 | Yakymyshyn | | G01R 15/207 |
| | | | | 324/117 R |
| 2006/0241880 A1 * | 10/2006 | Forth | | G01R 22/10 |
| | | | | 702/60 |
| 2007/0108992 A1 * | 5/2007 | Yanagisawa | | G01R 19/20 |
| | | | | 324/658 |
| 2007/0241739 A1 * | 10/2007 | Uenou | | G01R 21/133 |
| | | | | 324/76.17 |
| 2007/0290835 A1 * | 12/2007 | Engel Hardt | | G01R 15/142 |
| | | | | 340/538.16 |
| 2009/0039868 A1 * | 2/2009 | Montreuil | | G01R 15/202 |
| | | | | 324/117 H |
| 2010/0060479 A1 * | 3/2010 | Salter | | G01D 4/002 |
| | | | | 340/870.4 |
| 2011/0037410 A1 * | 2/2011 | Hsu | | H05B 33/0815 |
| | | | | 315/294 |
| 2012/0038446 A1 * | 2/2012 | McBee | | H01F 27/06 |
| | | | | 336/176 |

* cited by examiner

ENERGY MONITORING DEVICE

CROSS-REFERENCE TO RELATED APPLICATIONS

This application is a continuation of International Application Number PCT/US 2012/025696 filed Feb. 17, 2012, which claims the benefit of U.S. Provisional Application Ser. No. 61/444,057, filed on Feb. 17, 2011, the teachings of which are incorporated herein by reference.

FIELD OF INVENTION

The present invention relates to an energy monitoring device and, in particular, an energy monitoring device that may be installed on a current carrying wire to measure current and voltage at the point of installation.

BACKGROUND

With the increasing emphasis on reducing energy costs and increasing efficiency, the ability to accurately monitor energy and power usage within a house or building is becoming ever more important. Knowing which devices are consuming the most energy in a particular circuit, as well as the times and conditions under which the consumption occurs may provide important information about how and where energy is being used and what types of improvements can be made. Monitoring energy and power usage and costs may provide building owners and/or occupants as well as factory operators a better understanding of how to adjust their usage to reduce both their costs and the load on the power system.

SUMMARY

The present disclosure describes methods and apparatus for monitoring energy in current carrying wires. Current and voltage, as well as their variation with time, may be measured. The energy monitoring device may also calculate power and energy and apply corrections to measurements. This information may be transmitted as a digital signal over a cable to a central common collection device. Multiple energy monitoring devices may be coupled to the collection device. Operating power and a common reference voltage may be provided to the energy monitoring devices from the collection device over the cable. Synchronization of measurements between multiple energy monitoring devices may be achieved based on a count of line voltage zero crossings.

The current carrying wire being sensed may pass through a clamping mechanism that includes a current sensing Rogowski coil and a voltage tap. The clamp may also comprise two blocks and two clamp screws. The blocks, which may be brass, may have profiled faces. One block face may have a radius to match the maximum diameter wire to be measured. The other block face may have a "V" profile to center the wire as it is clamped. The voltage tap, which may be a voltage sense screw, may have a conical point on it suitable for piercing insulation surrounding the current carrying wire. After the wire is clamped the voltage sense screw may be tightened so that it pierces the insulation of the wire and contacts the inner current carrying member. The voltage sense screw and brass clamp blocks may now be at the same potential (voltage) as the wire. The sensed current and voltage may be conveyed to an energy measurement circuit.

BRIEF DESCRIPTION OF DRAWINGS

The above-mentioned and other features of this disclosure, and the manner of attaining them, may become more apparent and better understood by reference to the following description of embodiments described herein taken in conjunction with the accompanying drawings, wherein.

DETAILED DESCRIPTION

Figure 1:
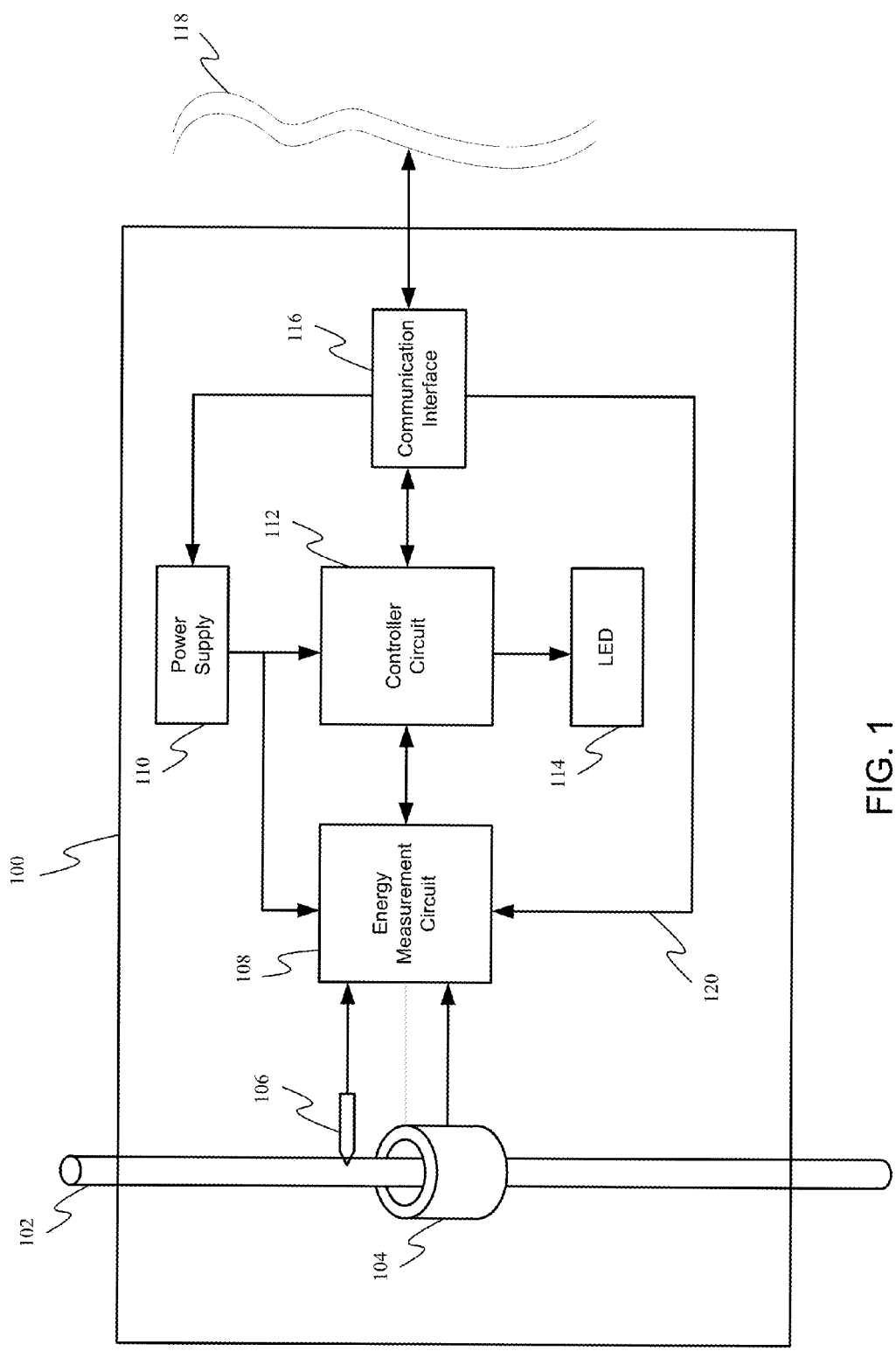
FIG. 1 is a block diagram of an embodiment of the energy monitoring device.

It may be appreciated that the present disclosure is not limited in its application to the details of construction and the arrangement of components set forth in the following description or illustrated in the drawings. The invention(s) herein may be capable of other embodiments and of being practiced or being carried out in various ways. Also, it may be appreciated that the phraseology and terminology used herein is for the purpose of description and should not be regarded as limiting as such may be understood by one of skill in the art.

Throughout the present description, like reference characters may indicate like structure throughout the several views, and such structure need not be separately discussed. Furthermore, any particular feature(s) of a particular exemplary embodiment may be equally applied to any other exemplary embodiment(s) of this specification as suitable. In other words, features between the various exemplary embodiments described herein are interchangeable, and not exclusive.

The present application relates to an energy monitoring device. The energy monitoring device may be a self contained energy monitoring device. When installed on a current carrying wire, the energy monitoring device may measure current and voltage, as well as their variation with time. The current carrying wire may be a continuous conductor, the continuity of which is not interrupted by the installation of the monitoring device. The energy monitoring device may also calculate power and energy and apply corrections to measurements. This information may be transmitted as a digital signal to a common central collection device over a cable. Multiple energy monitoring devices may be attached to one or more cables, such as, for example, ribbon cables. In addition, power, for example DC power for operation of the energy monitoring devices, and a signal conveying information about a common reference voltage may be provided to the energy monitoring devices from the collection device on the cable. Other cables or wires may be used to transmit power, information about a reference voltage and/or communication instead of, or in addition to, the ribbon cable(s). The size of the power supply in the collection device and the desired data transfer rate may determine the number of energy monitoring devices that may be attached to one collection device.

In general, the energy monitoring device may be configured as follows. A current carrying wire being sensed may be passed through a toroidal coil. The toroidal coil may be a Rogowski coil. The Rogowski coil may produce a voltage proportional to the rate of change of the current in the wire being sensed. The coil output may be filtered, amplified, and integrated. In a preferred embodiment, the amplification and integration may be performed by the energy measurement circuit, which may be an integrated circuit (IC). The current carrying wire being sensed may also pass through a clamping and voltage sense apparatus. The clamp may comprise two blocks, two clamp screws and a voltage sense screw. The blocks, which may be brass, may have profiled faces, one block face having a radius to match the maximum diameter wire to be measured. The other block face may have a "V" profile to center the wire as it is clamped. The voltage sense screw may have a conical point on it suitable for piercing insulation associated with the current carrying wire. After the wire is clamped the voltage sense screw may be tightened so that it pierces the insulation of the wire and contacts the inner current carrying member. The voltage sense screw and brass clamp blocks may now be at the same potential (voltage) as the wire. The sensed voltage and current may be conveyed to the energy measurement circuit.

FIG. 1 illustrates a block diagram of an embodiment of the energy monitoring device. As illustrated, the device may include a toroidal coil 104 for measuring current and a voltage tap 106 for measuring voltage. A current carrying wire 102 may pass through the toroidal coil 104 and the voltage tap 106 may be at least partially inserted into the current carrying conductor. The voltage tap, also referred to as a voltage sense conductor, may be an insulation displacement conductor as will be explained in greater detail below. The current carrying wire 102 may be a continuous conductor, the continuity of which is not interrupted by the installation or use of the toroidal coil 104 or the voltage tap 106. In some embodiments, the toroidal coil may be a Rogowski coil.

The Rogowski coil 104 and the voltage tap 106 may be electrically coupled to an energy measurement circuit 108. The energy measurement circuit 108 may be provided in one or two way communication with a controller circuit 112 which may be a microcontroller or other suitable processor and may include memory storage. The energy measurement circuit 108 may calculate energy based on current sense provided by the Rogowski coil 104, voltage sense provided by the voltage tap 106 and information about a common reference voltage provided by the collection device. The controller circuit 112 may handle communication of information, including energy information, back to the collection device through the communication interface 116, which may be in two way communication with the controller circuit 112. The communication interface 116 may transmit the energy information, in the form of digital data, over cable 118 which may serve as a common data bus, shared by multiple energy monitoring devices and the collection device. The communication interface 116 may also receive power from the cable 118, which may be provided to a power supply 110.

The communication interface 116 may also receive information about a common reference voltage, such as, for example a neutral reference voltage, which may be provided to the energy measurement circuit 108. The common reference voltage is common to the multiple energy monitoring devices and the collection device. The information about the common reference voltage may be an analog or digital signal that conveys information about the value, or an attenuated version of the value, of the common reference voltage. The attenuated version may be attenuated by a pre-determined scale factor. The signal comprising information about the common reference voltage may be buffered prior to distribution from the collection device to the monitoring devices.

The power supply 110 may be used to provide power of an appropriate voltage to various components of the device including, for example, the energy measurement circuit 108 and/or the controller circuit 112. In some embodiments, the power supply 110 may receive power from the communication interface 116. Furthermore, light emitting diodes (LED's) 114 or other indicators may be provided in communication with the controller circuit 112. The LEDs 114 may be useful for identifying device locations during system installation and maintenance. Electrical communication may be provided between the individual components through wires, such as copper wires.

The energy measurement circuit 108 may measure and/or calculate current, voltage, power, energy, and how they vary with time, as well as line phase associated with the current carrying wire. Some, or all, of these tasks may be accomplished in conjunction with controller circuit 112. In general, power may be determined as the product of voltage and current while energy may be determined as an integration of power over a time period of interest. Measured quantities, including current and voltage, may be sampled at particular times and at particular sampling rates which may be fixed and pre-determined or which may be programmable such as, for example, by the central collection device.

The controller circuit 112 may also store any of the measured and/or calculated data associated with the current carrying wire and subsequently transmit the stored data to a collection device. The transmission may be performed at regular or programmed intervals, or it may be performed in response to a request from the collection device or it may be performed at intervals determined by the data itself. For example, based on data obtained from one energy monitoring device, indicating an event of interest, the collection device may request additional previously obtained data from other energy monitoring devices that may be associated with that event of interest and provide more information about the event. As another example, the data may be transmitted when a measured or calculated value exceeds a given threshold.

The controller circuit 112 may also provide for synchronization of measurements between multiple energy monitoring devices by identifying zero crossings of the measured voltage and incrementing a counter in response to the zero crossing. The value of this counter may be latched or recorded in response to a synchronization request that is broadcast from the collection device to the energy monitoring devices. The recorded values may then be reported back to, or otherwise retrieved, from each of the monitoring devices to the collection device. In this manner, the collection device can correct for offset differences between the counters at each energy monitoring device. Synchronized timing may therefore be based on the counter values.

Figure 2:
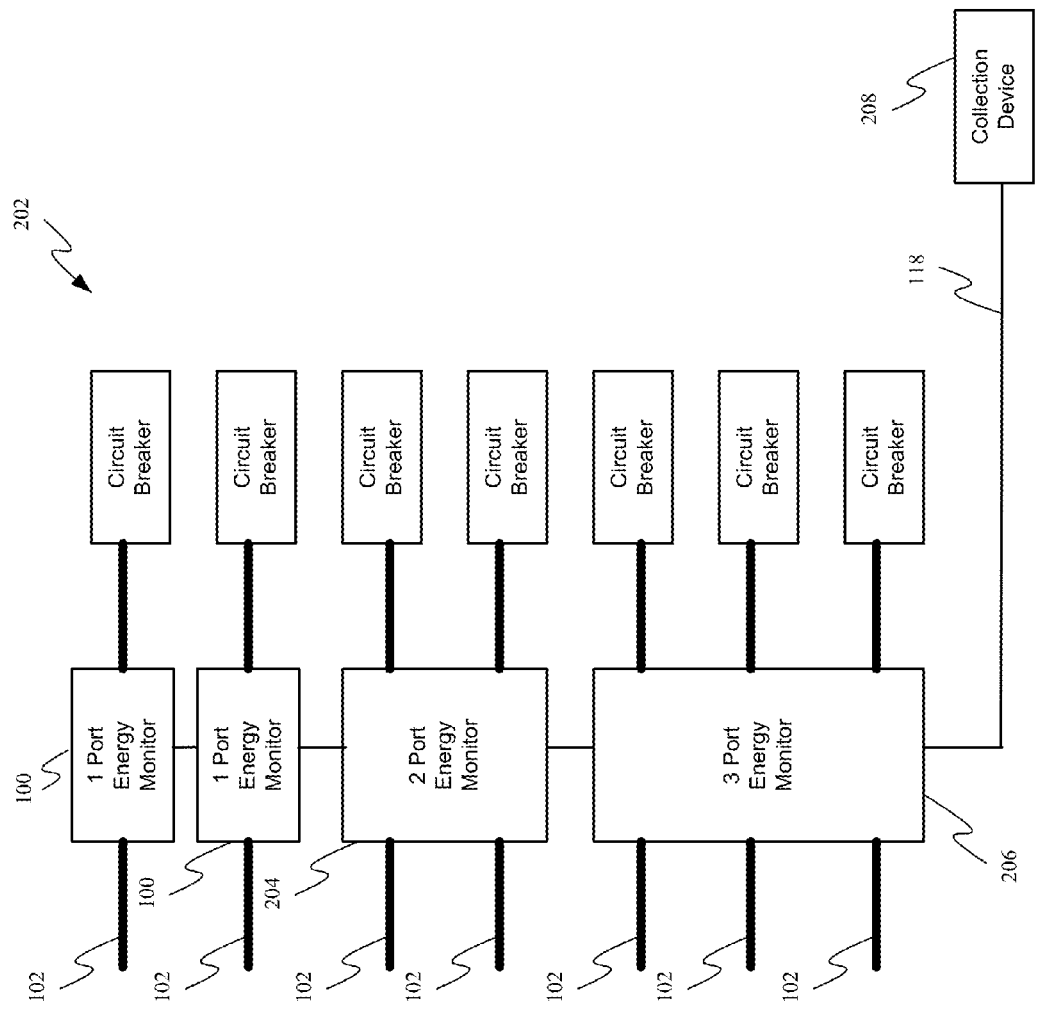
FIG. 2 is a block diagram of an application of an embodiment of the energy monitoring device.

FIG. 2 illustrates a block diagram of an application of an embodiment of the energy monitoring device. Shown is an array of circuit breakers 202 as may typically be arranged in a distribution panel. Current carrying wires 102, coupled to the out-feeds of the circuit breakers, pass through various embodiments of the energy monitor device including a one port energy monitor 100, a two port energy monitor 204 and a three port energy monitor 206. In some embodiments, the one port device may be used to monitor a single phase circuit, the two port device may be used to monitor a two phase circuit and the three port device may be used to monitor a three phase circuit. Other configurations are also possible, such as, for example, the use of three separate one port devices to monitor a three phase circuit.

In a preferred embodiment, the size of the energy monitoring devices may be selected such that they align with the circuit breakers according to a standard spacing in a distribution panel. This may facilitate installation of the devices and reduce the space required.

Also shown, is cable 118, which may be provided to couple the energy monitoring devices 100, 204, 206 to a central collection device 208. The cable 118 may serve as a common data bus, shared by multiple energy monitoring devices. The cable 118, which may be a ribbon cable, can be used to transmit power, signals conveying information about a common reference voltage and digital information pertaining to measured and/or calculated data. The use of a common bus configuration may decrease the number of individual wires that would otherwise be run from a central location to each sensor using up limited available space.

The collection device 208 may identify and enumerate the energy monitoring devices to which it is coupled over cable 118.

As described above, an energy monitoring device can have one or more ports, or through holes, to handle one or more wires (one wire per port) as illustrated in FIGS. 3 through 7.

Figure 3:
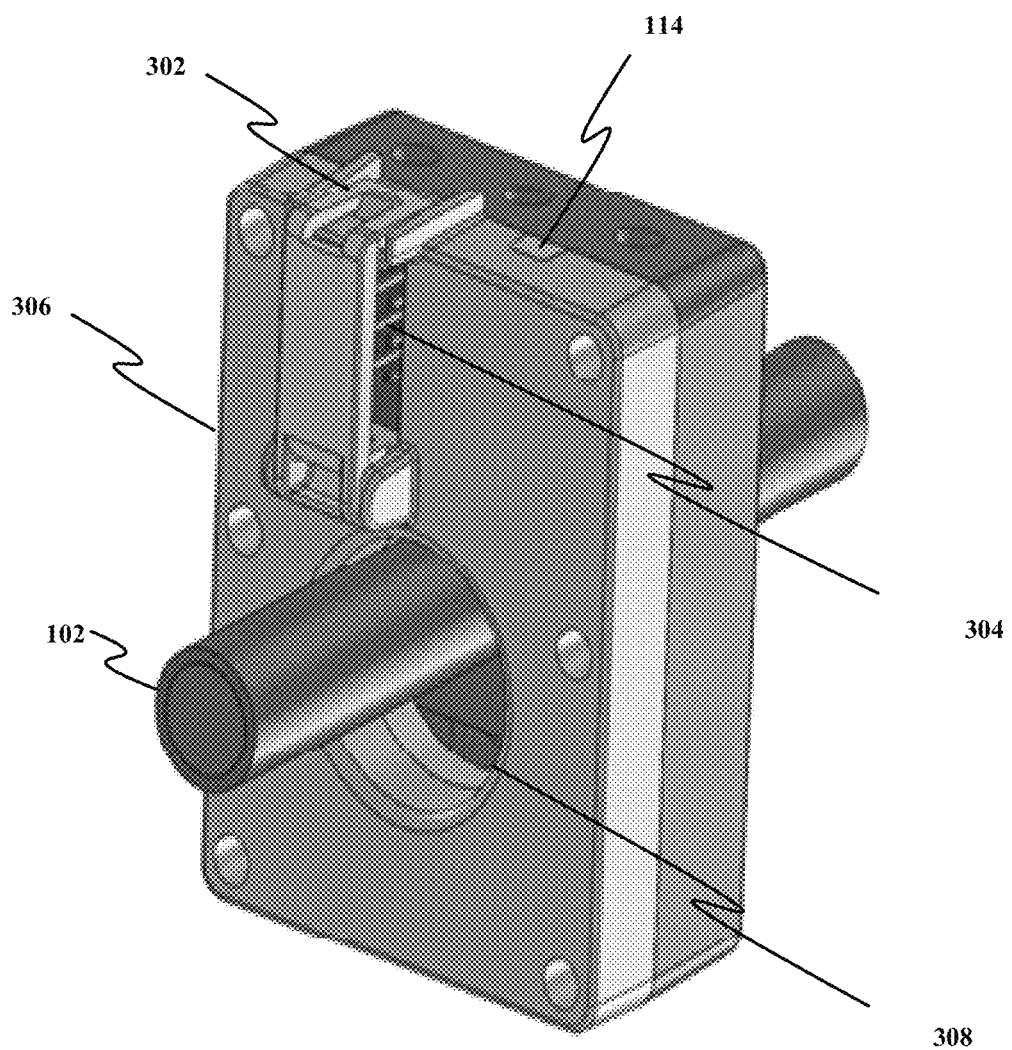
FIG. 3 illustrates a front perspective view of an embodiment of the energy monitoring device.

FIG. 3 illustrates a front perspective view of an embodiment of the energy monitoring device. The device housing 306 is shown comprising a single port 308 through which a current carrying wire 102 is secured. Also shown are LED 114, ribbon cable connector 304 and ribbon cable latch 302.

Figure 4:
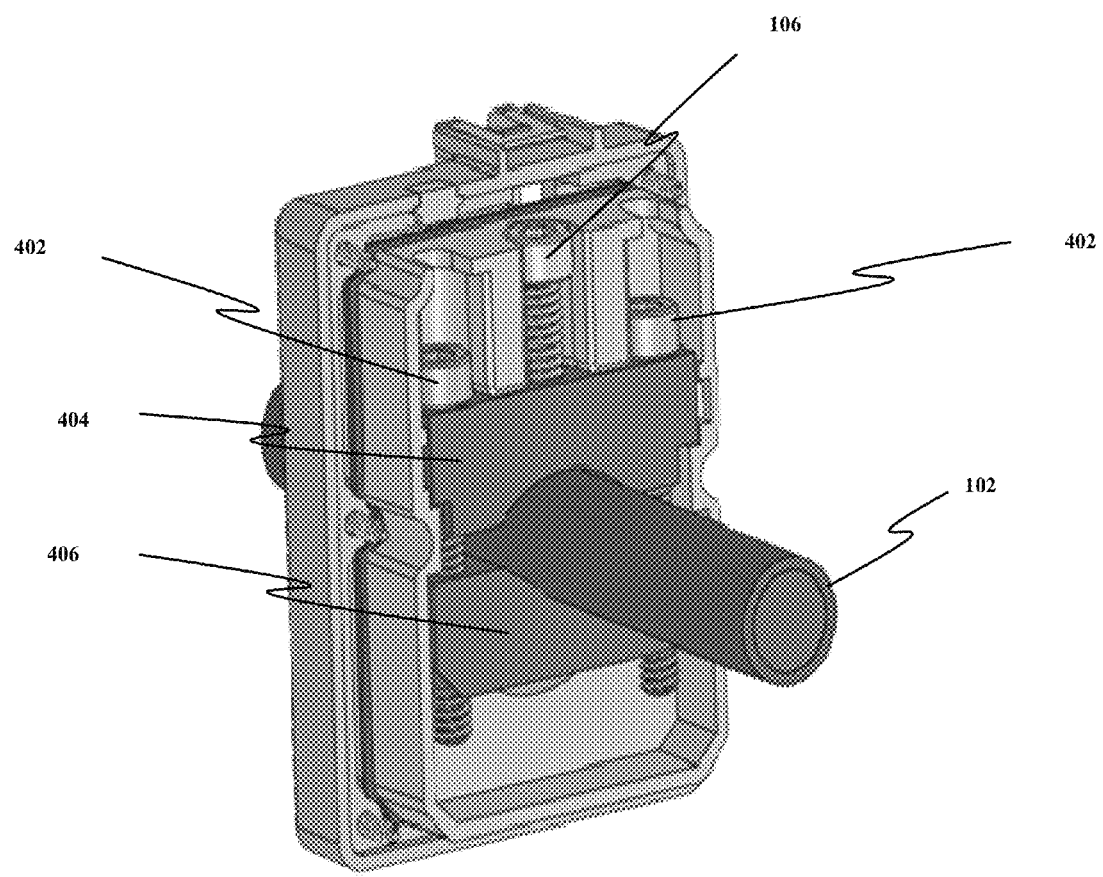
FIG. 4 illustrates a back perspective view of an embodiment of the energy monitoring device with the back cover removed.

FIG. 4 illustrates a back perspective view of an embodiment of the energy monitoring device with the back cover removed. Shown are current carrying wire 102 secured by upper clamp block 404 and lower clamp block 406. Clamp screws 402 may be employed to tighten and secure the clamp blocks around the wire. Also shown is voltage tap 106, which may be referred to as a voltage sense conductor. Voltage tap 106, in this embodiment, is a threaded screw that is received by and guided through upper clamp block 404, in a direction normal to the current carrying wire, to pierce the insulation of and make electrical contact with the current carrying wire 102. Voltage tap 106 may thus be considered an insulation displacement conductor.

Figure 5:
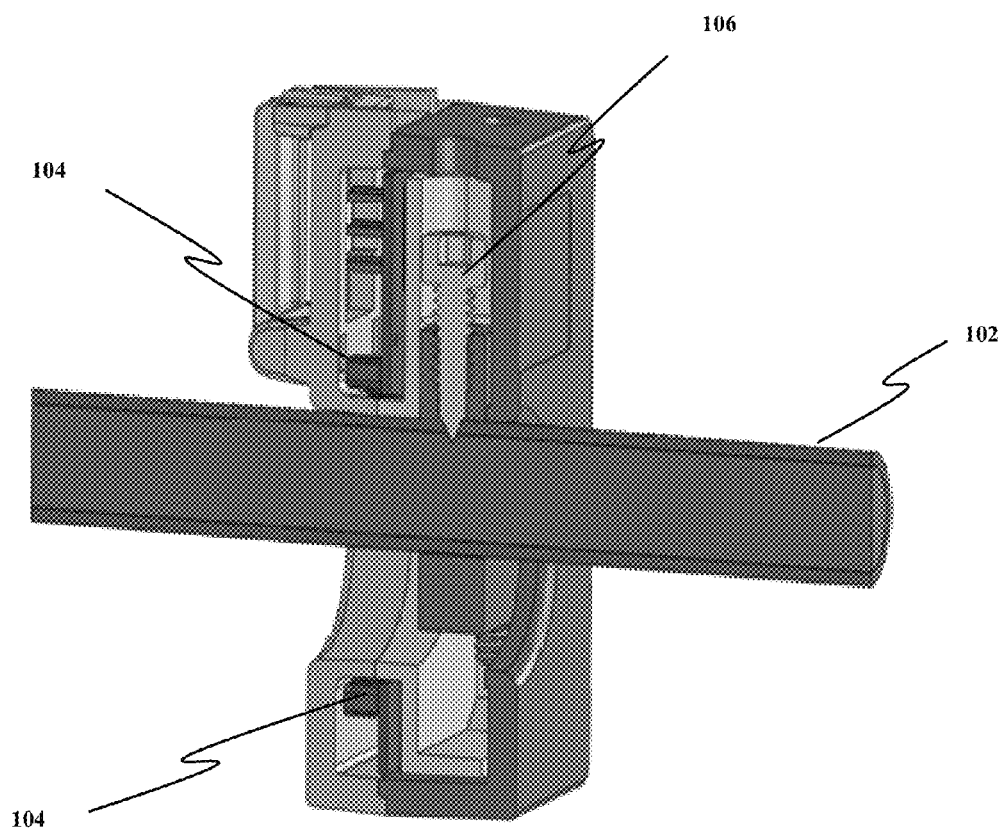
FIG. 5 illustrates a side cross-sectional view of an embodiment of the energy monitoring device.

FIG. 5 illustrates a side cross-sectional view of an embodiment of the energy monitoring device. Voltage tap 106 is shown here more clearly as a threaded screw with a conical tip piercing the insulation of and making contact with current carrying wire 102. Also shown is the toroidal coil 104 encircling the current carrying wire 102.

Figure 6:
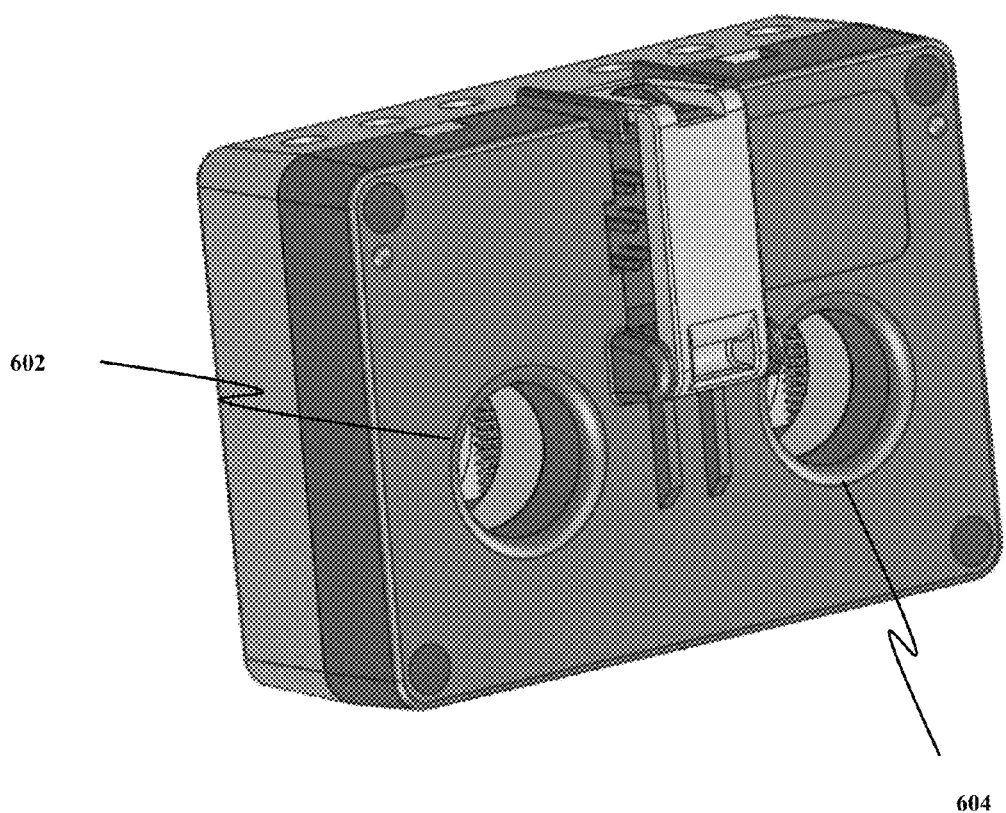
FIG. 6 illustrates a front perspective view of an embodiment of an energy monitoring device for monitoring two current carrying wires.

FIG. 6 illustrates a front perspective view of an embodiment of an energy monitoring device for monitoring two current carrying wires. Shown are two ports 602 and 604, each of which operates in the manner described above with respect to a single port.

Figure 7:
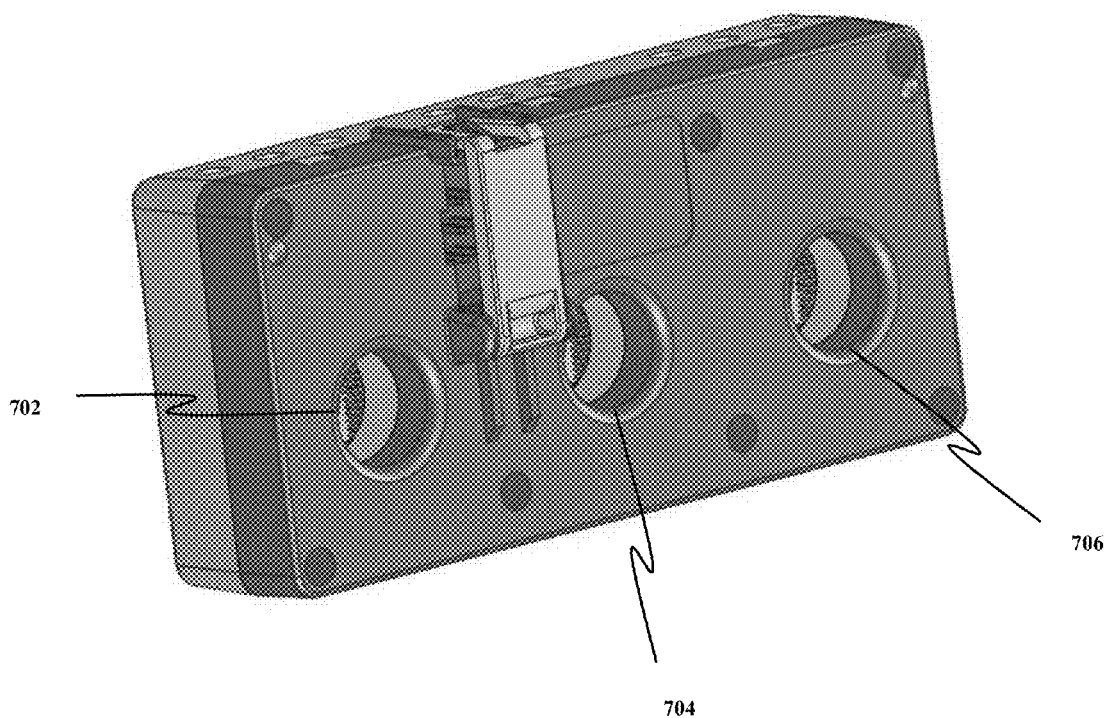
FIG. 7 illustrates a front perspective view of an embodiment of an energy monitoring device for monitoring three current carrying wires.

FIG. 7 illustrates a front perspective view of an embodiment of an energy monitoring device for monitoring three current carrying wires. Shown are three ports 702, 704 and 706, each of which operates in the manner described above with respect to a single port.

One, two and three port energy monitoring devices are illustrated; however energy monitoring devices with more openings may be created. In a preferred embodiment, the one, two, and three port energy monitoring devices may have opening diameters of ½" and 1", however, other sizes may be contemplated. The port spacing may match up with common circuit breaker spacing. The port diameter size in the energy monitoring device may also determine the maximum size wire that can be accommodated by that energy monitoring device.

It may be appreciated that the integral clamp and voltage tap may limit travel and, therefore, exposure of the voltage tap screw across a range of wire diameters. The clamp may be top referencing. This may be beneficial in some situations by maintaining the position of the energy monitoring device relative to a circuit breaker. The clamp may also lock the energy monitoring device to the wire being monitored. The clamp may also be placed externally to the energy monitoring device and bushings may be used to accommodate a wider range of wire gages for a given port size.

It may also be appreciated that when using Rogowski coils to measure current, the coils may be relatively inherently safe devices in contrast to transformers, which may be relatively dangerous if not properly handled, placed in an open circuit condition or exposed to excessive currents.

It may further be appreciated that the energy monitoring device may enable digital communication on a common bus, eliminating or reducing the need to run additional wires from the sensors to a central point through the limited space that is typically available. Furthermore a ribbon cable retention feature may be provided, locking the ribbon cable to the energy monitoring device. Housing protrusions may also be provided, which may exhibit, for example, two functions. One function may include keeping the energy monitoring device spaced back from the breaker to allow gasses to escape from the breaker in case of a breaker trip. The second function may include keeping line voltage elements of the energy monitoring device properly spaced from grounded metal.

It may be appreciated that with the "V" and "Arc" geometry of the clamp, the upper stationary half of the clamp has a radius clamping face that matches the radius of the through hole in the energy monitoring device. The lower clamp half has a "V" shape to center the wire being clamped. Centering allows the voltage tap screw to pierce the insulation normal to the wire.

Providing single or multiple ports may provide flexibility in deploying the sensors. Circuits within a facility can be single, two or three phase. It may be desirable to have all the wires/phases of a piece of equipment accommodated by a single energy monitoring device. In some embodiments, the measurements in a multiport energy monitoring device may be independent of each other.

Further, the voltage tap screw may be used to determine if the insulation has been properly pierced prior to powering up the system. A test probe may be inserted into the access hole of the voltage tap screw and continuity between the tap screw and the wire can be measured.

It may also be appreciated that at least one LED on each energy monitoring device, if present, may be used for set-up configuration and installation. System software, for example on the collection device, may energize the LED on an individual energy monitoring device. This may enable the installer to determine where the energy monitoring device is located in the facility. The installer may then associate the energy monitoring device to a specific circuit in the facility.

Further, each energy monitoring device may include a bar-coded serial number associated with it. This may allow tracking of the energy monitoring device and its associated calibration information. A duplicate barcode may also be provided on the energy monitoring device such that the duplicate may be removed and used during set-up to assign an energy monitoring device to a particular circuit.

Figure 8:
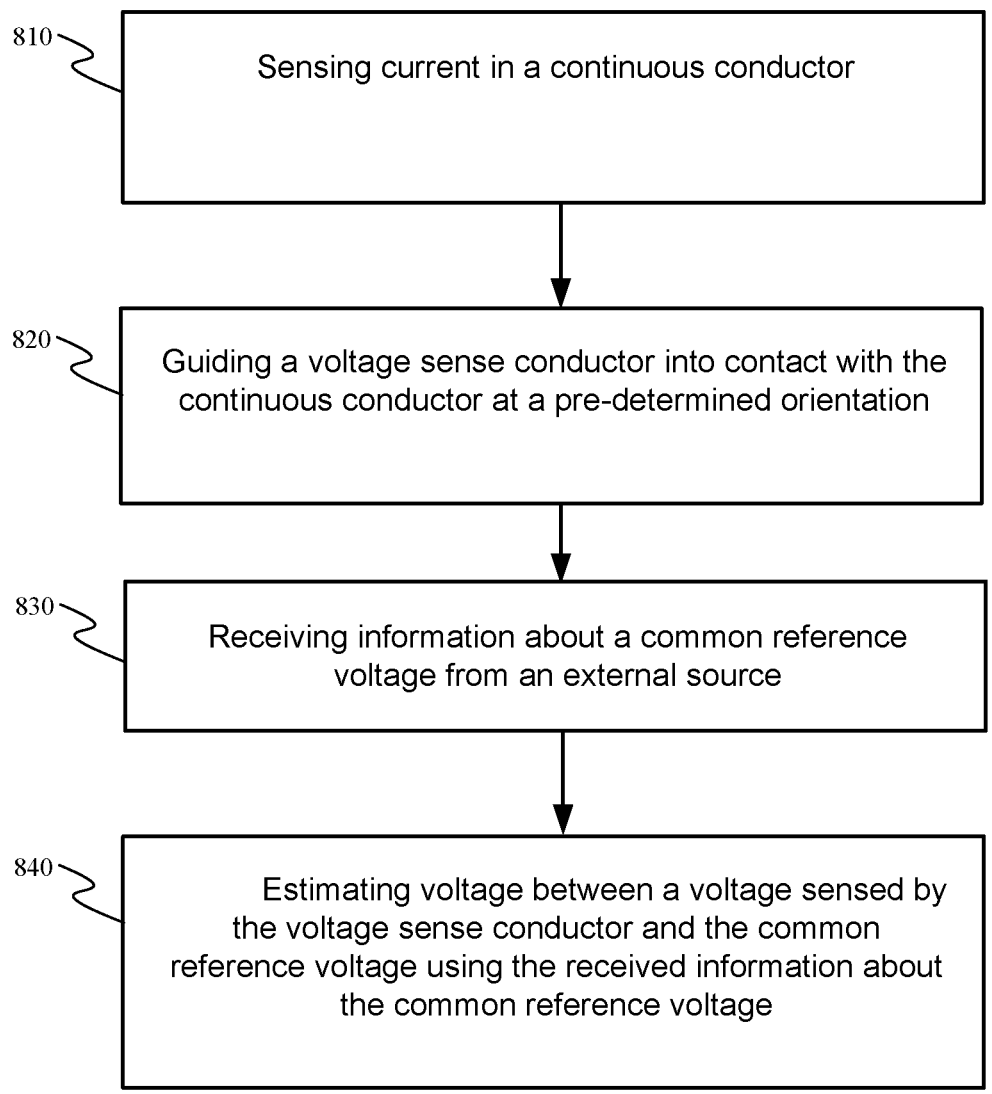
FIG. 8 illustrates a flowchart of operations of one exemplary embodiment consistent with the present disclosure.

Referring now to FIG. 8, there is supplied a flowchart 800 of one of the preferred methods consistent with an exemplary embodiment of an energy monitoring device according to the present disclosure. The method is provided for monitoring the voltage on and current in a continuous conductor. At operation 810, current is sensed in the continuous conductor. At operation 820, a voltage sense conductor is guided into contact with the continuous conductor at a pre-determined orientation. At operation 830, information is received about a common reference voltage. The information is received from an external source. At operation 840, a voltage is estimated between a voltage sensed by the voltage sense conductor and the common reference voltage, using the received information about the common reference voltage.

In view of the foregoing, it may be appreciated that the present disclosure also relates to an article comprising a non-transitory storage medium having stored thereon instructions that when executed by a machine result in the operation of sensing current in a continuous conductor; sensing voltage on a continuous conductor; receiving information about a common reference voltage from an external source; estimating voltage between the sensed voltage and the common reference voltage using the information about the common reference voltage; calculating energy values based on the estimated voltage and the sensed current; storing the calculated energy values; and transmitting the stored calculated energy values to a collection device.

Figure 9:
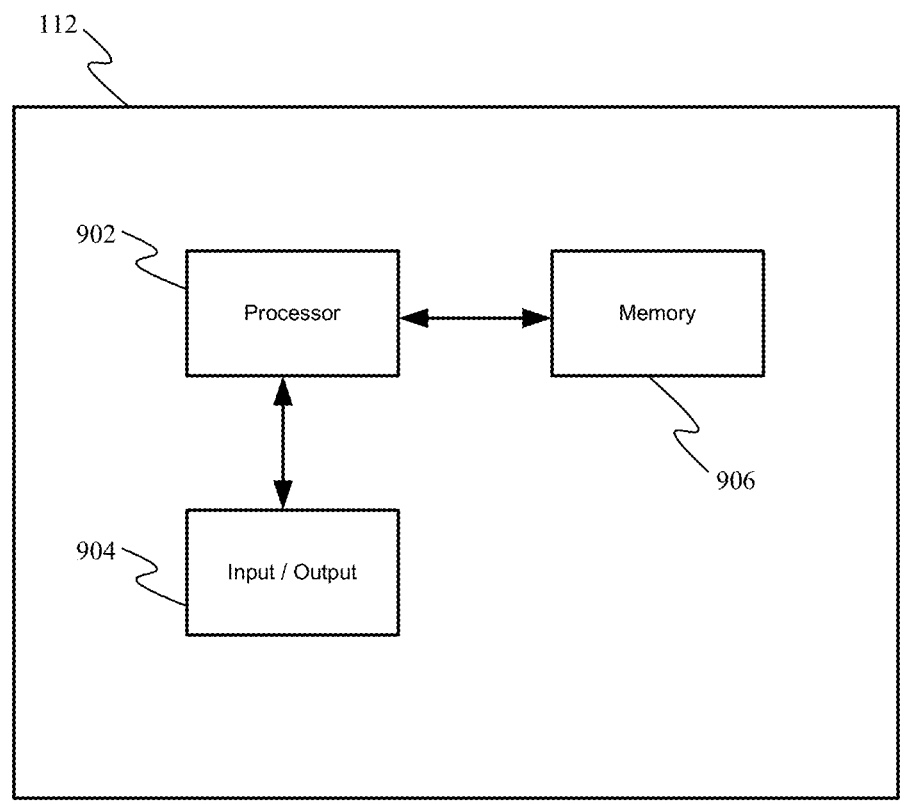
FIG. 9 illustrates a processor, machine readable media and input/output system that may be employed to provide energy monitoring.

It should also be appreciated that the functionality described herein for the embodiments of the present invention may therefore be implemented by using hardware, software, or a combination of hardware and software, as desired. If implemented by software, a processor and a machine readable medium are required. The processor may be any type of processor capable of providing the speed and functionality required by the embodiments of the invention. Machine-readable memory includes any non-transitory media capable of storing instructions adapted to be executed by a processor. Non-transitory media include all computer-readable media with the exception of a transitory, propagating signal. Some examples of such memory include, but are not limited to, read-only memory (ROM), random-access memory (RAM), programmable ROM (PROM), erasable programmable ROM (EPROM), electronically erasable programmable ROM (EEPROM), dynamic RAM (DRAM), magnetic disk (e.g., floppy disk and hard drive), optical disk (e.g. CD-ROM), and any other device that can store digital information. The instructions may be stored on a medium. In some embodiments, the instructions may be stored in either a compressed and/or encrypted format. Accordingly, in the broad context of the present invention, and with attention to FIG. 9, the system and method for the herein disclosed energy monitoring device may be accomplished with a processor (902) and machine readable media (906) and an input/output system (904).

The foregoing description of several methods and embodiments has been presented for purposes of illustration. It is not intended to be exhaustive or to limit the claims to the precise steps and/or forms disclosed, and obviously many modifications and variations are possible in light of the above teaching. It is intended that the scope of the invention be defined by the claims appended hereto.

What is claimed is:

1. A device for monitoring the voltage on and current in a continuous conductor, said device comprising:
   a current sensor configured to sense current in said continuous conductor;
   a voltage sense conductor, wherein said voltage sense conductor is configured to displace insulation, if present, on said continuous conductor;
   a guided path for guiding said voltage sense conductor through a clamp block configured to bring said voltage sense conductor into contact with said continuous conductor at a pre-determined orientation;
   a communication interface configured to receive information about a common reference voltage from a source, wherein said source is external to said device and distributed to said communication interface by a collection device and information about said common reference voltage is a neutral reference voltage common to said device and said collection device;
   a voltage measuring circuit configured to estimate voltage between a voltage sensed by said voltage sense conductor and said common reference voltage using said information about said common reference voltage; and
   a power supply configured to receive power through said communication interface to provide power to said device.

2. The device of claim 1, wherein said current sensor is a Rogowski coil.

3. The device of claim 1, further comprising an energy measurement circuit configured to calculate energy values based on samples of said estimated voltage and samples of said sensed current.

4. The device of claim 3, further comprising a controller circuit configured to determine sampling times for said energy measurement circuit and to store said calculated energy values.

5. The device of claim 4, wherein said communication interface is further configured to transmit said stored calculated energy values to said collection device.

6. The device of claim 5, wherein said communication interface is further configured to transmit said stored calculated energy values in response to a request from said collection device.

7. The device of claim 4, wherein said controller circuit is further configured to identify zero crossing times of said estimated voltage, wherein said zero crossing times provide synchronization between a plurality of said monitoring devices.

8. The device of claim 4, wherein said controller circuit is further configured to determine a state of a circuit breaker based on said estimated voltage.

9. The device of claim 1, further comprising a housing configured to clamp onto said continuous conductor, wherein said continuous conductor is coupled to a circuit breaker and said housing is sized such that a plurality of said monitoring devices align with a plurality of said circuit breakers.

10. The device of claim 9, wherein said housing further comprises a V-shaped lower clamp half configured to center said continuous conductor and said clamp block, which includes an arc-shaped upper clamp half, wherein said V-shaped lower clamp half and said clamp block are configured to secure said continuous conductor.

11. The device of claim 9, wherein said housing is further configured with a plurality of clamps to receive a plurality of said continuous conductors, said plurality of clamps spaced to align with said plurality of circuit breakers.

12. The device of claim 1, further comprising a light emitting diode (LED) configured to provide a visual indication in response to said communication interface receiving a command from a collection device.

13. The device of claim 1, wherein said voltage sense conductor is configured to displace said insulation by piercing said insulation.

14. The device of claim 1, wherein said voltage sense conductor and said clamp block are at the same potential as said continuous conductor upon contact of said voltage sense conductor and said continuous conductor.

15. A method for monitoring the voltage on and current in a continuous conductor, said method comprising:
sensing current in said continuous conductor;
guiding a voltage sense conductor through a clamp block into contact with said continuous conductor at a pre-determined orientation, wherein said voltage sense conductor is configured to displace insulation, if present, on said continuous conductor to contact said continuous conductor;
receiving in an energy measurement circuit information about a common reference voltage from an external source, which is distributed from a collection device, wherein said common reference voltage includes a neutral reference voltage common to said energy measurement circuit and said collection device; and
estimating voltage between a voltage sensed by said voltage sense conductor and said common reference voltage using said information about said common reference voltage.

16. The method of claim 15, wherein said current sensor is a Rogowski coil.

17. The method of claim 15, further comprising calculating energy values based on samples of said estimated voltage and samples of said sensed current.

18. The method of claim 17, further comprising determining sampling times for said energy calculation and storing said calculated energy values.

19. The method of claim 18, further comprising transmitting said stored calculated energy values to said collection device.

20. The method of claim 19, further comprising transmitting said stored calculated energy values to said collection device in response to a request from said collection device.

21. The method of claim 15, further comprising identifying zero crossing times of said estimated voltage, wherein said zero crossing times provide synchronization between a plurality of said monitoring devices.

22. The method of claim 15, further comprising determining a state of a circuit breaker based on said estimated voltage, wherein said continuous conductor is an out-feed of said circuit breaker.

23. The method of claim 15, further comprising setting the state of an LED in response to receiving a command from said collection device.

24. The method of claim 15, wherein said voltage sense conductor is configured to displace said insulation by piercing said insulation.

25. The method of claim 15, wherein upon contact of said voltage sense conductor and said continuous conductor said voltage sense conductor and said clamp block are at the same potential as said continuous conductor.

26. A system for collecting voltage and current information, said system comprising:
a collection device configured to monitor a common reference voltage and distribute information about said common reference voltage; and
one or more monitoring devices coupled to said collection device, said monitoring devices comprising:
a current sensor configured to sense current in a continuous conductor;
a voltage sense conductor, wherein said voltage sense conductor is configured to displace insulation, if present, on said continuous conductor;
a guided path for guiding said voltage sense conductor through a clamp block configured to bring said voltage sense conductor into contact with said continuous conductor at a pre-determined orientation;
a communication interface configured to receive said information about said common reference voltage from said collection device, wherein said information about said common reference voltage includes a neutral reference voltage common to said one or more monitoring devices and said collection device;
a power supply configured to receive operating power supplied by said collection device through said communication interface; and
an energy measurement circuit configured to estimate voltage between a voltage sensed by said voltage sense conductor and said common reference voltage using said information about said common reference voltage.

27. The system of claim 26, wherein said monitoring devices are configured to send, and said collection device is configured to receive information associated with said estimated voltage and said sensed current.

28. The system of claim 26, wherein said monitoring devices further comprise a controller circuit configured to enable said monitoring devices to count the number of zero crossings of said estimated voltage.

29. The system of claim 28, wherein said collection device is further configured to transmit a synchronization message to said monitoring devices, said synchronization message causing said monitoring devices to record said count, said collection device further configured to retrieve said recorded count from said monitoring devices.

30. The system of claim 26, wherein said collection device is configured to enumerate said monitoring devices.

31. The system of claim 26, wherein said monitoring devices further comprise a light emitting diode (LED) configured to provide a visual indication in response to said communication interface receiving a command from said collection device.

32. The system of claim 26, wherein said voltage sense conductor and said clamp block are at the same potential as said continuous conductor upon contact of said voltage sense conductor and said continuous conductor.

* * * * *

UNITED STATES PATENT AND TRADEMARK OFFICE
CERTIFICATE OF CORRECTION

PATENT NO. : 10,054,616 B2
APPLICATION NO. : 13/968552
DATED : August 21, 2018
INVENTOR(S) : Kevin M. Johnson, Greg Hunter and Paul C. M. Hilton Page 1 of 1

It is certified that error appears in the above-identified patent and that said Letters Patent is hereby corrected as shown below:

On the Title Page

Item (73) the Assignee should read "OutSmart Power Systems, LLC, Natick, MA (US)" instead of "The NanoSteel Company, Inc., Providence, RI (US)".

Signed and Sealed this
Second Day of July, 2019

Andrei Iancu
*Director of the United States Patent and Trademark Office*